United States Patent
Bhattacharyya

(10) Patent No.: US 7,208,793 B2
(45) Date of Patent: Apr. 24, 2007

(54) SCALABLE INTEGRATED LOGIC AND NON-VOLATILE MEMORY

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 65 days.

(21) Appl. No.: 10/995,839

(22) Filed: Nov. 23, 2004

(65) Prior Publication Data

US 2006/0110870 A1    May 25, 2006

(51) Int. Cl.
*H01L 29/76* (2006.01)
(52) U.S. Cl. .................... 257/314; 438/197
(58) Field of Classification Search ........... 257/314, 257/315, 316; 438/197, 257, 258
See application file for complete search history.

(56) References Cited

U.S. PATENT DOCUMENTS

| 5,328,859 | A | * | 7/1994 | Vo et al. ............. 438/374 |
| 5,783,478 | A |   | 7/1998 | Chau et al. |
| 6,417,085 | B1 | * | 7/2002 | Batra et al. ........... 438/591 |
| 6,432,801 | B1 | * | 8/2002 | Lee .................. 438/585 |
| 6,706,594 | B2 | * | 3/2004 | Hurley .............. 438/258 |
| 6,743,681 | B2 |   | 6/2004 | Bhattacharyya |
| 2002/0109142 | A1 |   | 8/2002 | Joo et al. |
| 2004/0178470 | A1 |   | 9/2004 | Hieda |

OTHER PUBLICATIONS

M. Takata, et al "New Non-Volatile Memory with Extremely High Density Metal Nano-Dots," International Electron Devices Meeting 2003, IEEE, IEDM, Technical Digest, pp. 553-556.
C.H. Lee et al., "A Novel SONOS Structure of SiO2/SiN/Al2O3 with TaN metal Gate for multi-gig flash memories", IEDM, 2003, pp. 613-616.
B. De Salvo et al., "How Far will Silicon Nanocrystals push the scaling limits of NVM technologies?", IEDM, 2003, pp. 613-616.
R. Muralidhar et al., "A 6V Embedded 90nm Silicon Nanocrystal Nonvolatile Memory", IEDM, 2003, pp. 597-600.
K.W. Guarini et al., "Low Voltage, scalable nonocrystal Flash memory fabricated by templated self assembly", IEDM, 2003, pp. 541-544.

(Continued)

*Primary Examiner*—Phuc T. Dang
(74) *Attorney, Agent, or Firm*—Leffert Jay & Polglaze, P.A.

(57) ABSTRACT

A scalable, logic transistor has a pair of doped regions for the drain and source. A gate insulator layer is formed over the substrate and between the drain and source regions. A gate stack is formed of a gate layer, such as polysilicon or metal, between two metal nitride layers. A compatible non-volatile memory transistor can be formed from this basic structure by adding a high-K dielectric constant film with an embedded metal nano-dot layer between the tunnel insulator and the gate stack.

19 Claims, 3 Drawing Sheets

OTHER PUBLICATIONS

S.J. Baik et al., "High Speed and Nonvolatile Si Nonocrystal Memory for Scaled Flash Technology using Highly Field-Sensitive Tunnel Barrier", IEDM, 2003, pp. 545-548.

A. Nakajima et al., "Atomic-layer-deposited Ultrathin Si-Nitride Gate Dielectrics- A better choice for Sub-tunneling Gate Dielectrics", IEDM, 2003, pp. 657-660.

M. Takata et al., "New Non-Volatile Memory with Extremely High Density Metal Nano-Dots", IEDM, 2003, pp. 553-556.

C. Lee et al., "Operational and Reliability Comparison of Discrete-Storage Non-Volatile Memories: Advantages of Single and Double-layer Metal Nanocrystals", IEDM, 2003, pp. 557-560.

M. Kayanagi et al., "Metal Nano-Dot Memory for High-Density Non-Volatile Memory Application", Department of Bioengineering and Robotics, Tohoku University, Japan, Silicon NV Workshop, 2004, pp. 1-5.

* cited by examiner

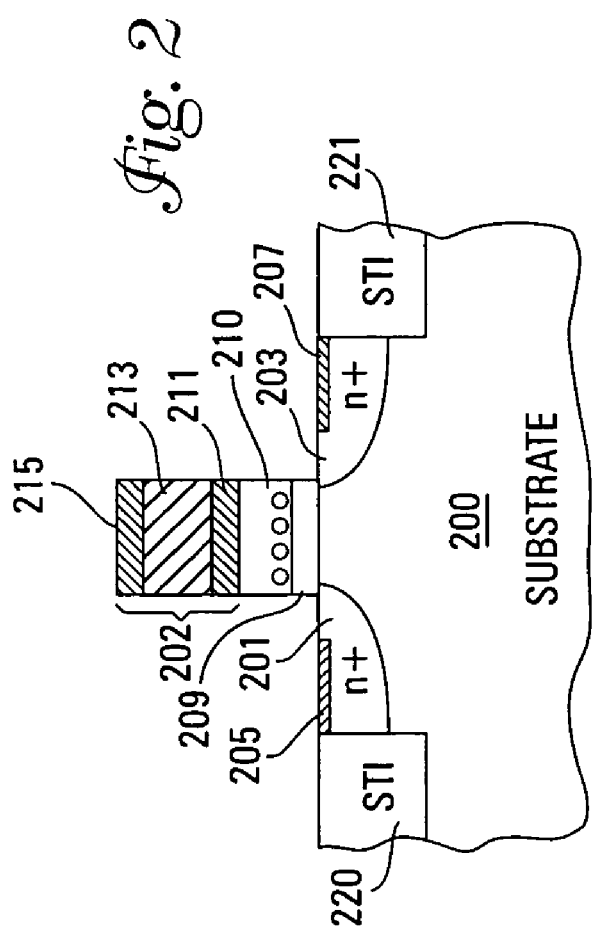
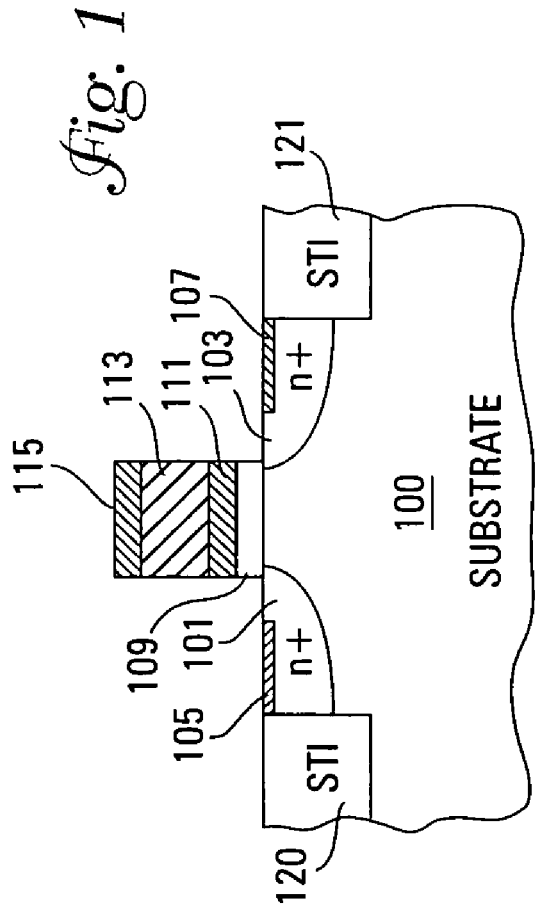

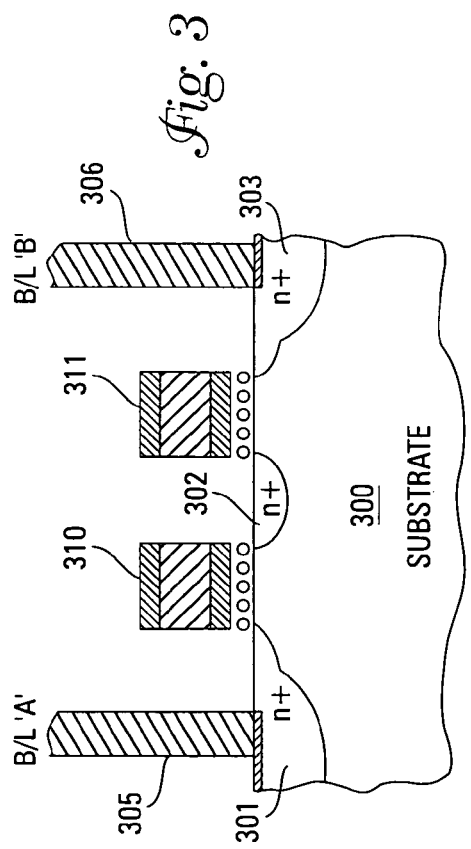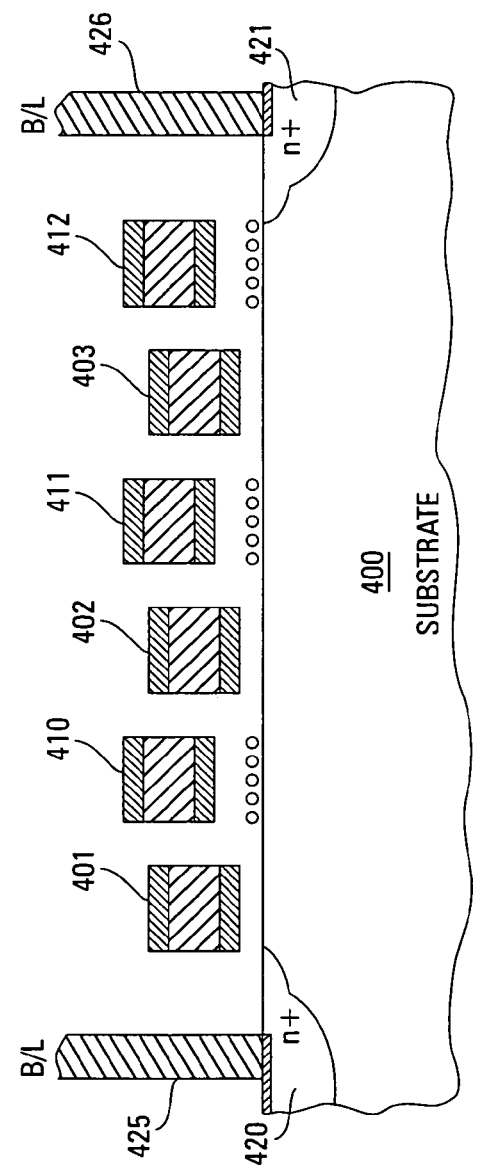

SCALABLE INTEGRATED LOGIC AND NON-VOLATILE MEMORY

TECHNICAL FIELD OF THE INVENTION

The present invention relates generally to memory and logic devices and in particular the present invention relates to scalable non-volatile memory devices in logic technology environment.

BACKGROUND OF THE INVENTION

Memory and logic devices are typically provided as internal, semiconductor, integrated circuits in computers and many other electronic devices including handheld devices such as cellular telephones and personal digital assistants. There are many different types of memory including static random-access memory (SRAM), read only memory (ROM), flash memory, dynamic random access memory (DRAM), and synchronous dynamic random access memory (SDRAM) that are functionally integrated with logic devices such as microprocessors, microcontrollers, digital signal processors, programmable logic devices, wireless communication, and networking.

Many current and future devices require increasing integration of logic and memory functions within the same integrated circuit technology. Current microprocessors, for example, embed ROM and SRAM arrays with logic libraries, logic device (e.g., ALU), and logic circuits to achieve desired device functionality within the same chip. A basic building block for a logic cell is a CMOS inverter that consists of a pair of PMOS and NMOS transistors integrated to have common input and output nodes between power supply ($V_{DD}$) and ground potentials. As the size of a unit transistor shrinks with scaling, large arrays of memories including DRAMs are being integrated into logic devices to achieve powerful functions.

Conventional DRAM cells are comprised of a switching transistor and an integrated storage capacitor tied to the storage node of the transistor. Charge storage is enhanced by providing appropriate storage capacity in the form of a stacked capacitor or a trench capacitor in parallel with the depletion capacitance of the floating storage node. DRAM cells are volatile and therefore lose data when the power is removed. Additionally, due to leakage, the capacitor must be refreshed periodically to maintain the charge.

As computers and other devices mentioned above become smaller and their performance increases, the computer memories have also gone through a corresponding size reduction and performance increase. For example, DRAM cells, typically comprised of silicon IC technology, has been progressively scaled in feature size from the nearly 2000 nm node technology of prior years to the current 100 nm node technology.

During this period, power supply voltages have been scaled from nearly 8 volts to the approximately 2 volts that is presently used. The gate insulator, primarily $SiO_2$, has had an effective oxide thickness (EOT) that has been scaled from 50 nm to approximately 5 nm at the present time. At thicknesses below 5 nm, leakage through the oxide becomes appreciable thus providing constraints and challenges towards further scalability from the standpoint of power, speed, and circuit reliability. This is especially true for dynamic circuits.

Aside from oxide integrity and reliability, transistor design for deep sub-micron channel length (i.e., L<200 nm) requires critical control of thermal budget to achieve control of short channel effect, performance, and reliability. Integration of embedded DRAM below 100 nm node has been a challenge not only due to capacitor scalability concerns of DRAM cells but also because of the requirement for higher thermal budgets to achieve leakage, yield, and density objectives of the embedded DRAM cells.

Recently, embedded non-volatile memory (NVM) technology has been gaining considerable attention due to the potential of low power and hand-held device applications. It would be desirable to have the non-volatile flash memory attributes in a cell that has DRAM performance. However, conventional floating gate flash memory technology has not been scalable in power supply voltage levels, consumes higher than desired power during programming, and also requires high programming voltages (e.g., 10–20V for the 100 nm technology node). Embedding such a device requires on-chip generation of the high voltages and routing these voltages in an otherwise scaled low voltage logic technology adds considerable process complexity and cost and compromises functionality.

For the reasons stated above, and for other reasons stated below which will become apparent to those skilled in the art upon reading and understanding the present specification, there is a need in the art for a more scalable, low power, high performance integrated logic memory that would provide high performance logic and non-volatile memory at lower power.

SUMMARY

The above-mentioned problems with embedded scalable non-volatile memory and other problems are addressed by the present invention and will be understood by reading and studying the following specification.

The present invention encompasses integration of elements of a scalable, logic transistor with elements of non-volatile memory cells to be formed on a substrate comprising a plurality of doped regions. The doped regions act as the source/drain areas for a transistor element. A gate oxide insulator is formed over the substrate and substantially between the doped regions to form the NFET element of the logic transistor. Similarly, another gate oxide insulator is formed over the n-well region (not shown) to form the PFET element of the logic transistor between the p+ doped regions formed within the n-well. A gate stack is formed over the gate oxide insulator to form the appropriate gate for the logic transistor element. The gate stack is comprised of a first metal nitride layer, a doped silicon (p+ or n+) gate layer formed over the first metal nitride layer, and a second metal silicide layer formed over the gate layer to lower the resistance of the gate line.

For the non-volatile memory transistor element, an additional high-k insulator layer with embedded metal dots near the gate insulator interface is incorporated between the gate insulator and the gate stack. In this manner, a flash memory cell that is compatible and scalable with the logic transistor is created. Both transistors are formed using a low temperature process integration scheme to ensure high performance.

Further embodiments of the invention include methods and apparatus of varying scope.

BRIEF DESCRIPTION OF THE DRAWINGS

FIG. 1 shows a cross-sectional view of one embodiment of a logic field effect transistor element in accordance with the structure and method of the present invention.

FIG. 2 shows a cross-sectional view of one embodiment of a flash transistor element in accordance with the structure and method of the present invention.

FIG. 3 shows a cross-sectional view of one embodiment of a single gate NOR flash cell in accordance with the structure and method of the present invention.

FIG. 4 shows a cross-sectional view of one embodiment of a split gate NAND flash cell in accordance with the structure and method of the present invention.

DETAILED DESCRIPTION

Figure 5:
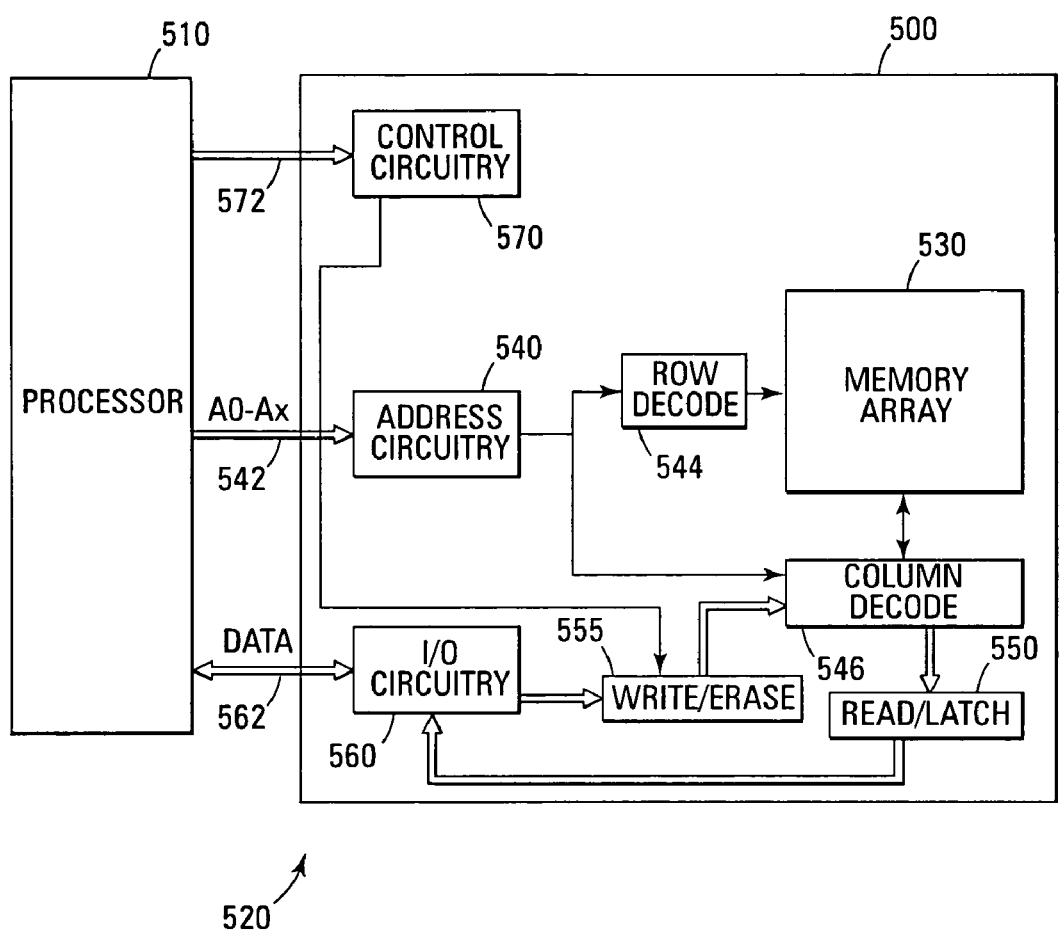
FIG. 5 shows a block diagram of one embodiment of an electronic system of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

The thermal budget of an integrated circuit includes all of the high temperature steps required for junction formation and activation as well as thin film formation (deposition/oxidation) and annealing to reduce stress and defects. The thermal processes used to manufacture integrated circuits help define region, film, and layer interfaces. These processes supply the thermal energy required for oxidation, film formation, dopant activation, and defect control. Thermal budget control is important to device and junction performance since the thermal processes can also drive diffusion and defect annealing.

The structure and method of the present invention employs low thermal budget integration for both the logic transistors and the non-volatile memory transistors. This process scheme and the materials used for the logic and non-volatile memory transistor architecture provide greater scalability and compatibility in operating voltages.

FIG. 1 illustrates a cross-sectional view of one embodiment of a logic field effect transistor (FET) incorporating the low thermal budget structure and method of the present invention. The FET is comprised of a substrate 100 with two doped regions 101 and 103 that act as the source and drain regions. The doped regions 101 and 103 are separated from other transistors by shallow trench isolation (STI) 120 and 121. Metal-silicide contacts 105 and 107 are formed on the doped regions 101 and 103 respectively.

In one embodiment, the doped regions 101 and 103 are n+ regions doped into a p-type substrate 100 to form an NFET transistor element. These diffusion regions can be formed using n+ doped amorphous silicon, followed by rapid thermal anneal to limit thermal budget and subsequent silicidation. Similarly, for a PFET transistor element (not show), p+ diffusion source/drain regions could be formed over an n-well region. The source/drain regions and substrate of the present invention are not limited to any one conductivity type or formation technique.

A gate oxide insulator 109 for the logic FET is formed over the substrate and substantially between the source/drain regions 101 and 103. The gate insulator 109 is comprised of an ultra-thin silicon dioxide ($SiO_2$), silicon nitride (SiN), or silicon oxynitride (SiON) layer with a relative dielectric constant (K) in the range of 5.0–7.5. The SiON layer has the added benefit of low leakage for longer charge retention. Other possibilities include a combination of one or more monolayers of $SiO_2$ followed by an ultra-thin layer of high-k laminate such as $Pr_2O_3$ or PrSiON. This limits the gate insulation leakage current to the desired level.

The gate insulator 109 can be formed on the substrate 100 by atomic layer deposition (ALD). In one embodiment, the gate insulator 109 can have a total physical thickness in the range of 2–2.5 nm for a power supply voltage of $V_{DD}$=1.0V. This thickness can be appropriately scaled for lower power supply voltage generation. This provides an equivalent oxide thickness (EOT) of 1.0–1.5 nm.

An ultra-thin layer (e.g., 1–2 nm) of conductive metal nitride 111 is formed over the gate oxide insulator 109. This layer 111 can be tantalum nitride (TaN), titanium nitride (TiN) or some other metal nitride material. This layer 111 acts as an appropriate passivation layer and diffusion barrier for undesirable impurities and dopants.

A gate layer 113 is then formed over the passivation layer 111. The gate layer 113 can be comprised of a doped polysilicon or metal material. In one embodiment, the polysilicon 113 is an n+ conductivity material that is formed by using phosphorus doped amorphous silicon followed by RTA anneal and silicidation (e.g., nickel silicidation for both gate and diffusion). In an alternate embodiment, plasma chemical vapor deposition (CVD) or some other low temperature processing of boro-silicate glass (for boron impurity) and phoso-silicate glass (for phosphorous impurity) might be employed for dopant sources.

In a silicon gate, a final RTA anneal step can be employed for dopant activation, interface state density control, leakage control, and film stability for the gate stack. A top layer 115 of metal silicide, such as nickel silicide, is formed over the silicon gate 113.

For metal gate processing, an appropriate ALD process can be employed. In one embodiment, this processing can include a layer 115 of ALD Tungsten or Nickel combined with tungsten-silicide or nickel-silicide respectively.

The fixed threshold FET of the present invention is designed to have a threshold $V_t$ in the range of 0.3–0.4 V. For $V_{dd}$=1V, L=0.05 μm, W=1.0 μm, $I_{on}$ and $I_{off}$ are expected to be >300 μA/μm and <1×10$^{-9}$ A/μm respectively. The gate leakage current is estimated to be <<1 A/cm$^2$ at $V_{dd}$. The interface state density is expected to be <1×10$^{11}$/cm$^2$.

FIG. 2 illustrates a cross-sectional view of one embodiment of a non-volatile memory device that incorporates the low thermal budget structure and method of the present invention. The non-volatile memory device shares many of the same components of the logic FET illustrated in FIG. 1.

A tunnel oxide insulator 209 for the memory transistor is formed over the substrate and substantially between the source/drain regions 201 and 203. The tunnel insulator 209 is comprised of an ultra-thin silicon dioxide ($SiO_2$), silicon nitride (SiN) or silicon oxynitride (SiON) layer with a relative dielectric constant (K) in the range of 5.0–7.5. The SiON layer has the added benefit of longer charge retention. Other possibilities include a combination of one or more monolayers of $SiO_2$ followed by an ultra-thin layer of high-k laminate such as praseodymium oxide ($Pr_2O_3$) or praseodymium silicon oxynitride (PrSiON). This limits the gate insulation leakage current to the desired level.

The tunnel insulator 209 can be formed on the substrate 200 by atomic layer deposition (ALD). In one embodiment, the tunnel insulator 209 can have a total physical thickness in the range of 2–2.5 nm for a power supply voltage of $V_{DD}=1.0V$. This thickness can be appropriately scaled for lower power supply voltage generation. This provides an equivalent oxide thickness (EOT) of 1.0–1.5 nm.

The memory transistor's gate stack 202 is comprised of a lower ultra-thin layer (e.g., 1–2 nm) of conductive metal nitride 211. This layer 211 can be tantalum nitride (TaN), titanium nitride (TiN) or some other metal nitride material. This layer 211 acts as an appropriate passivation layer and diffusion barrier for undesirable impurities and dopants.

A gate layer 213 is formed over the passivation layer 211. The gate layer 213 can be comprised of a doped polysilicon or metal material. In one embodiment, the polysilicon 213 is an n+ conductivity material that is formed by using phosphorus doped amorphous silicon followed by RTA anneal and silicidation (e.g., nickel silicidation for both gate and diffusion). In an alternate embodiment, plasma chemical vapor deposition (CVD) or some other low temperature processing of boro-silicate glass (for boron impurity) and phoso-silicate glass (for phosphorous impurity) might be employed for dopant sources.

In a silicon gate, a final RTA anneal step can be employed for dopant activation, interface state density control, leakage control, and film stability for the gate stack. A top layer 215 of metal silicide, such as nickel silicide, is formed over the silicon gate 213.

For metal gate processing, an appropriate ALD process can be employed. In one embodiment, this processing can include a layer 215 of ALD Tungsten or Nickel combined with tungsten-silicide or nickel-silicide respectively.

In one embodiment, the gates for both the logic FET element and the non-volatile memory element are substantially identical. Alternate embodiments might make slight changes such as material differences.

The gate stack 202 is formed over a layer 210 comprised of extremely high density metal nano-dots embedded into a high dielectric constant (high-K) insulator material. The embedded metal nano-dots are used as a charge retention layer for the non-volatile memory transistor. Each metal dot acts as an isolated, one-dimensional, small floating gate. Therefore, even if a charge leakage path exists between one small floating gate and the substrate or the control gate, the remaining nano-dots in the film layer retain the charge.

In one embodiment, the density range of the metal nano-dots in the high-K insulator layer 210 is in the range of $1 \times 10^{13}$ to $10 \times 10^{13}$ with typical dot sizes in the range of 1–3 nm and spaced greater than 3 nm apart in the high-K dielectric material. Alternate embodiments can use different densities, dot sizes, and spacing.

The metal dot elements can include platinum (Pt), gold (Au), Cobalt (Co), Tungsten (W) or some other metal that provides deep energy electron and hole traps. In one embodiment, metal dot layer 210 is deposited by sputtering or evaporation at relatively low temperatures.

The metal dots are embedded in a high-K dielectric medium 210 that could also be co-sputtered or deposited subsequently by an ALD technique. The high-K dielectric film 210 might be comprised of Alumina ($Al_2O_3$), Hafnium ($HfO_2$), Tantalum Oxide ($Ta_2O_5$), HfTaO, HfAlO, $ZrO_2$, LaSiON, or laminated combinations of the above that are deposited by an ALD technique or sputtering. The high-K dielectric medium 210 can further be comprised of Zirconium Oxide ($ZrO_2$), Lanthanum Oxide ($La_2O_3$), Praseodymium Oxide ($Pr_2O_3$), and high-K oxynitrides such as HfSiON, PrSiON, and mixed high-K oxides of Al and La, Al and Pr, Al and Zr, and silicides.

A typical thickness for the dielectric film 210 may range from 5–10 nm with an EOT ranging from 2–3 nm. The overall EOT for the non-volatile FET gate insulator stack may be of 3.5–4 nm for a programming voltage of 2–4 Volts to produce a sub-microsecond programming time. Alternate embodiments can use different thickness ranges to provide different programming voltages.

The non-volatile transistor of FIG. 2 could be programmed at control gate voltage of +/−2V to +/−4V for 10–1000 ns with $V_{t(hi)}=1.6V$ and $V_{t(low)}=0.2V$. The device could be read at 0.7V (i.e., $V_{dd}-V_{tfixed}$). The device would exhibit retention of $10^6$ seconds and an endurance of $10^{14}$ cycles. The programming voltage could be achieved by simple boot strapped circuitry on-chip and could be applied to the control gate for $V_{t(hi)}$ for electron trapping and to the substrate for $V_{t(low)}$ for electron detrapping and hole trapping.

The method to manufacture the above-described transistors of the present invention uses standard silicon gate process technology but also includes multiple ALD steps to provide low temperature processing of highly controllable ultra-thin films. These steps could include a high pressure, low temperature forming gas anneal or RTA after the nitride or oxynitride gate insulator processing to reduce interface state density at the Si/insulator interface. The low temperature anneal also stabilizes Si—H bonds at the interface. Additionally, the thermal budget for impurity doping and activation is controlled by using doped amorphous silicon or doped glass as impurity sources and RTA as stated earlier.

During the gate stack process integration, an oxide (e.g., $SiO_2$) hard mask is used over the logic transistor elements to protect the tunnel insulator during the processing of the metal nano-dots and high-K insulator deposition steps for the non-volatile device. The oxide is selectively etched off and the common gate metal deposition steps are subsequently performed for both logic and non-volatile transistor elements.

The flash memory and logic transistors of the present invention can be used in both NOR architecture (including NROM) and NAND architecture memory arrays. The flash memory cells can be used to store data in a non-volatile fashion while the logic FETs can be used for control/access purposes in the memory array and to provide a variety of logic functions.

In a NOR configuration, the memory cells are arranged in a matrix and operate in parallel mode. The gates of each metal nano-dot memory cell of the array matrix are connected by rows to wordlines and their drains are connected to column bitlines. The source of each metal nano-dot memory cell is typically connected to a common source line.

A NAND flash memory device is comprised of an array of metal nano-dot cells arranged in series chains in a string. Each of the metal nano-dot cells are coupled drain to source in each series chain. A word line that spans across multiple series chains is coupled to the control gates of each floating gate cell in a row in order to control their operation. The bitlines are eventually coupled to sense amplifiers that detect the state of each cell.

FIG. 3 illustrates a cross-sectional view of one embodiment of single gate NOR flash memory cells in accordance with the present invention. The substrate 300, in the illustrated embodiment, is a p-type silicon with n+ doped areas 301–303 that act as the source/drain regions for the cells. Alternate embodiments use different conductivity materials for the substrate/doped areas.

The doped area that acts as the drain region 301 is coupled to a first bitline 'A' 305 through a metallized contact. The doped area that acts as the common source region 302 is also coupled through another metallized contact elsewhere (not shown) in the cross-section. The doped region 303 for the neighboring bit is coupled to a second bitline 306 'B' through a metallized contact as shown in FIG. 3.

FIG. 4 illustrates a cross-sectional view of one embodiment of split-gate NAND flash memory cells in accordance with the present invention. This figure illustrates only a small portion of a serial string of elements. A typical memory string is comprised of 32 bits in a string. One bit is comprised of a non-volatile memory element and a logic element together (e.g., 401 and 410) as shown in the illustration. Other configurations may be comprised of only a non-volatile element as a single bit in a string.

Each logic element 410–412 in the NAND string comprises multiple functions. One function is to select a particular non-volatile memory element. A second function involves protection from over-erasure for that particular non-volatile memory element.

The p-type substrate 400 is comprised of n+ doped regions 420 and 421 that act as the source/drain regions. In this embodiment, the first region 420 is the drain region and the second region 421 is the source region. Alternate embodiments can use different conductivity materials for the substrate/doped areas. Bitlines 425 and 426 are coupled to the source/drain regions 420 and 421 through metallization contacts.

The array is comprised of a plurality of control/access transistors 401–403 that function to control access to one of a plurality of memory cells 410–412. The non-volatile memory elements are comprised as discussed previously with the same composition as the logic transistors except for the metal nano-dot layer embedded in the high-K dielectric material.

FIG. 5 illustrates a functional block diagram of a memory device 500 that can incorporate the memory cell structure of the present invention. The memory device 500 is coupled to a processor 510. The processor 510 may be a microprocessor or some other type of controlling circuitry. The memory device 500 and the processor 510 form part of an electronic system 520 that may also be a system on chip application. The memory device 500 has been simplified to focus on features of the memory that are helpful in understanding the present invention.

The memory device includes an array of memory cells 530 that can be comprised of the logic and flash memory cells previously illustrated. The memory array 530 is arranged in banks of rows and columns. The gates of each row of memory cells are coupled with a wordline while the drain and source connections of the memory cells are coupled to bitlines.

An address buffer circuit 540 is provided to latch address signals provided on address input connections A0–Ax 542. Address signals are received and decoded by a row decoder 544 and a column decoder 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts.

The memory device 500 reads data in the memory array 530 by sensing voltage or current changes in the memory array columns using sense/buffer circuitry 550. The sense/buffer circuitry, in one embodiment, is coupled to read and latch a row of data from the memory array 530. Data input and output buffer circuitry 560 is included for bi-directional data communication over a plurality of data connections 562 with the controller 510. Write circuitry 555 is provided to write data to the memory array.

Control circuitry 570 decodes signals provided on control connections 572 from the processor 510. These signals are used to control the operations on the memory array 530, including data read, data write (program), and erase operations. The control circuitry 570 may be a state machine, a sequencer, or some other type of controller.

The memory device illustrated in FIG. 5 has been simplified to facilitate a basic understanding of the features of the memory. A more detailed understanding of internal circuitry and functions of memories are known to those skilled in the art.

CONCLUSION

In summary, the embodiments of the present invention provide a low thermal budget (e.g., approximately less than 600° C.) integration scheme to manufacture both logic and non-volatile memory transistors with minimum added process complexity. Using low temperature techniques and predetermined materials, transistors can be produced that have a compatible gate stack. Additionally, the transistors are scalable in operating voltages such that special and complex process technology (e.g., well and isolation) as well as circuitry (e.g., charge pump and high voltage decoding) are not required for embedded logic and memory operation in a system on chip application.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A scalable, non-volatile transistor comprising:
   a substrate comprising a plurality of doped regions;
   a gate insulator formed on the substrate and substantially between the plurality of doped regions;
   a high dielectric constant insulator having embedded metal nano-dots formed over the gate insulator; and
   a gate stack formed over the high dielectric constant insulator and comprising:
   a metal nitride layer formed over the gate insulator;
   a gate layer formed over the metal nitride layer; and
   a metal silicide layer formed over the gate layer.

2. The transistor of claim 1 wherein the substrate is a p-type silicon and the doped regions are n+ regions.

3. The transistor of claim 1 wherein the gate layer is a polysilicon gate.

4. The transistor of claim 1 wherein the gate layer is a metal gate.

5. The transistor of claim 1 wherein the metal nitride layer is titanium nitride.

6. The transistor of claim 1 wherein the metal silicide layer is comprised of one of cobalt, nickel, tungsten, or titanium.

7. The transistor of claim 1 wherein the gate insulator is an oxide.

8. A scalable, non-volatile memory transistor comprising:
a substrate comprising a plurality of doped regions that form source/drain areas;
a tunnel insulator formed on the substrate and substantially between the plurality of source/drain areas;
a high dielectric constant material layer with an embedded metal nano-dot layer formed over the tunnel insulator;
a metal nitride layer formed over the high dielectric constant material layer;
a gate layer formed over the metal nitride layer; and
a metal silicide layer formed over the gate layer.

9. The transistor of claim 8 wherein the embedded metal nano-dot layer is comprised of a high density nano-dot layer having a density range of $2 \times 10^{13}$ and $10 \times 10^{13}$.

10. The transistor of claim 9 wherein the metal nano-dots have a size in the range of 1–3 nm and are spaced apart by 3 nm.

11. The transistor of claim 9 wherein the dielectric medium is comprised of one of $Al_2O_3$, $HfO_2$, $ZrO_2$, $Ta_2O_5$, HfSiON, HfTaO, $Pr_2O_3$, PrSiON, LaSiON, HfAlO, or mixed oxides of Al and La, Al and Pr, and Al and Zr.

12. The transistor of claim 8 wherein the metal nano-dots are comprised of one of platinum, gold, cobalt, or tungsten.

13. The transistor of claim 8 wherein the metal nano-dot layer is embedded in the high dielectric constant material substantially closer to the tunnel insulator than the metal nitride layer.

14. The transistor of claim 8 wherein the tunnel insulator, high dielectric constant material layer, gate layer, the metal nitride layer, and the metal silicide layer are formed by low temperature processing.

15. A memory array comprising:
a scalable logic transistor comprising:
  a substrate comprising a plurality of doped regions;
  a gate insulator formed over the substrate and substantially between the plurality of doped regions; and
  a first gate stack formed over the gate insulator and comprising a metal nitride layer formed over the gate insulator;
  a gate layer formed over the metal nitride layer; and
  a metal silicide layer formed over the gate layer; and
a scalable, non-volatile memory transistor, coupled to the logic transistor, the non-volatile memory transistor comprising:
  a substrate comprising a plurality of doped regions;
  a tunnel insulator formed over the substrate and substantially between the plurality of doped regions;
  a high dielectric material layer with an embedded metal nano-dot layer formed over the tunnel insulator; and
  a second gate stack, having the same architecture as the first gate stack, formed over the high dielectric material layer.

16. The array of claim 15 wherein the first and second gate stacks are comprised of a tantalum nitride layer, a polysilicon gate material, and a tungsten silicide layer.

17. The array of claim 15 wherein the first and second gate stacks are comprised of a titanium nitride layer, a polysilicon gate material, and a nickel silicide layer.

18. An electronic system comprising:
a processor for generating memory signals; and
a non-volatile memory device, coupled to the processor and operating in response to the memory signals, the memory device comprising a plurality of scalable, non-volatile memory cells, each cell comprising:
  a substrate comprising a plurality of source/drain regions;
  a tunnel insulator formed on the substrate and substantially between the plurality of source/drain regions;
  a high dielectric constant insulator layer comprising an embedded metal nano-dot layer formed over the tunnel insulator;
  a metal nitride layer formed over the high dielectric constant insulator layer;
  a gate layer formed over the metal nitride layer; and
  a metal silicide layer formed over the gate layer.

19. The system of claim 18 and further including a plurality of scalable logic transistors coupled to the non-volatile memory cells, each scalable logic transistor comprising:
a substrate comprising a plurality of source/drain regions;
a gate insulator formed on the substrate and substantially between the plurality of source/drain regions;
a metal nitride layer formed over the gate oxide insulator;
a gate layer formed over the metal nitride layer; and
a metal silicide layer formed over the gate layer.

* * * * *